United States Patent [19]

Seibel

[11] Patent Number: 4,783,247

[45] Date of Patent: Nov. 8, 1988

[54] METHOD AND MANUFACTURE FOR ELECTRICALLY INSULATING BASE MATERIAL USED IN PLATED-THROUGH PRINTED CIRCUIT PANELS

[75] Inventor: Markus Seibel, Mainz, Fed. Rep. of Germany

[73] Assignee: Hoechst Aktiengesellschaft, Frankfurt am Main, Fed. Rep. of Germany

[21] Appl. No.: 863,569

[22] Filed: May 15, 1986

[30] Foreign Application Priority Data

May 17, 1985 [DE] Fed. Rep. of Germany ....... 3517796

[51] Int. Cl.$^4$ .......................... B05D 5/12; B05D 1/36; B25D 13/04
[52] U.S. Cl. ............................... 204/181.1; 204/180.2; 156/901; 156/902; 428/901; 427/97
[58] Field of Search ...................... 204/181.1; 156/901, 156/902; 428/901; 427/97

[56] References Cited

U.S. PATENT DOCUMENTS

| | | | |
|---|---|---|---|
| 3,296,099 | 1/1967 | Dinella | 204/15 |
| 3,558,441 | 1/1971 | Chadwick et al. | 204/15 |
| 3,934,334 | 1/1976 | Hanni | 29/625 |
| 4,188,415 | 2/1980 | Takahashi et al. | 427/97 |
| 4,305,975 | 12/1981 | Ikari et al. | 427/97 |
| 4,315,845 | 2/1982 | Takahashi et al. | 260/42.28 |
| 4,321,290 | 3/1982 | Thams | 204/181.1 X |
| 4,375,498 | 3/1983 | Le Ming et al. | 204/181.1 |
| 4,478,884 | 11/1984 | Barnes et al. | 427/97 |
| 4,483,751 | 11/1984 | Murayama et al. | 204/37.1 |
| 4,500,399 | 2/1985 | Hart et al. | 204/181 |
| 4,592,816 | 6/1986 | Emmous et al. | 204/181.1 |
| 4,601,916 | 7/1986 | Arachtingi | 428/901 |

FOREIGN PATENT DOCUMENTS

| | | |
|---|---|---|
| 55469/80 | 10/1980 | Australia . |
| 0177686 | 4/1986 | European Pat. Off. . |
| 2453788 | 5/1975 | Fed. Rep. of Germany . |
| 0071541 | 6/1977 | Japan ......... 204/181.3 |
| 5022519 | 3/1985 | Japan ......... 427/97 |
| 1476882 | 6/1977 | United Kingdom . |

Primary Examiner—John F. Niebling
Assistant Examiner—John S. Starsiak, Jr.
Attorney, Agent, or Firm—Foley & Lardner, Schwartz, Jeffery, Schwaab, Mack, Blumenthal & Evans

[57] ABSTRACT

Method and manufacture for electrically insulating base material used for perforated plated-through printed circiut panels with a metal core. The method includes applying a radiation-curable layer of insulating material to the preperforated metal core by an electrostatic spray method and precuring by irradiation or heat, coating with a further thin, thermally curable layer of insulating material by electrophoresis, drying the layer by heating and likewise partially curing it so that it is no longer capable of flowing, but yet is still reactive, optionally applying further curable insulating layers, and finally, fully thermally curing the entire coating of insulating material. The coatings obtained are impervious and are of uniform thickness even at the hole walls.

17 Claims, No Drawings

METHOD AND MANUFACTURE FOR ELECTRICALLY INSULATING BASE MATERIAL USED IN PLATED-THROUGH PRINTED CIRCUIT PANELS

BACKGROUND OF THE INVENTION

The invention relates to a method for the production of an electrically insulating base material for the manufacture of perforated plated-through printed circuit panels with a metal core.

The use of panels of insulating material with a metal core as base material for printed circuit panels is known. The metal panel serving as the core may consist, for example, of iron or (preferred on account of its low weight and its good thermal conductivity) of aluminum. If the panel is to be provided with holes for making plated-through holes, the latter are in general produced, for example, drilled, even before the insulating material is applied. Uniform and pore-free insulation, especially of the hole walls, is an essential requirement for the usability of such products. Because of the required heat removal, the insulating layers should be as thin as possible, it being essential, however, that the freedom from pores is maintained. Many methods are known which are concerned with this problem.

According to U.S. Pat. No. 3,296,099 a metal panel provided with prepunched holes is coated with an epoxy powder by the fluidized bed sintered method. In this process the entire surface including the hole walls are coated with epoxy resin. A disadvantage is the hourglass-like or egg-timer-like shape of the insulating layer inside the holes; towards the center of the panel the coating is always thicker than at the ends of the holes. In order to insulate the hole edges adequately it is necessary to accept very thick insulating layers in the region of the hole center. It is therefore necessary to start from relatively large hole diameters in the metal core. As a result of this only a relatively low surface utilization is in turn possible in the construction of printed circuit panels. The trend of modern printed circuit panel techniques is, however, towards printed circuit panels with everincreasing conductor track density.

In German Offenlegungsschrift No. 2,453,788 a method is described in which holes in aluminum panels are filled with loose thermoplastic and thermosetting plastic material and the material is then compacted into solid plugs which completely fill the holes. Narrow holes are then drilled in these plugs so that a hole wall coated with insulating material is left. This method certainly yields cylindrical holes, but is complicated and expensive.

In German Pat. No. 1,954,973 a method is described in which the predrilled aluminum panels are first provided with a first coat of insulating material and coated by spraying with the actual thermosetting material in 3 to 10 layers lying on top of each other and then the coatings are thermally cured. In this method, just as in the fluidized bed sintering method, the insulating material first softens on heating, it flows and becomes thinned at the hole edges (hourglass effect). This can only partially be compensated for by the multiple coatings, and the coating process becomes very expensive as a result of this.

A further known coating method is electrostatic spraying. In this case there are produced at the hole walls layers whose thickness decreases with the distance from the hole edge since the electric field is screened by the metal of the panel. The effect becomes all the more pronounced the thicker the metal panel and the more restricted the hole diameter are. The insulating material coatings must, however, be pore-free. This requirement can be better fulfilled with increasing layer thickness. However, it is in the nature of the electrostatic spray coating method that uniform and, in particular, pore-free coatings are not obtained in the holes.

The electrophoretic coating method, which is also known, results in relatively pore-free and uniform coatings. However, to make possible the migration of the particles to the electrode, it is necessary for them to be charged with ions. As a result of this, however, the insulating properties of the coatings, in particular the bulk and surface resistance, are reduced.

Electrophoretic coating of anodized aluminum with organometallic thermosetting compounds is described in European Patent Application No. 58,023. Since the compounds used in this case contain no ionic groups which produce conductivity, it is necessary to use high voltages and long coating times. In this case, for example, 500 to 10,000 volts and 30 to 120 minutes are specified. This is very expensive and hazardous.

Incidentally, it is very difficult to bond the deposited conductor track metal firmly to the said insulating materials. Etching with chromic acid as is otherwise usual is of litle effect for the substances used here.

According to German Offenlegungsschrift No. 3,047,287, to improve the anchoring of the conducting metal to the insulating material surface, an anchoring or adhesive material layer is applied. This layer is applied only to the flat principal faces of the base material, not to the surfaces of the hole walls. The metal layer therefore exhibits low adhesion at the walls, which may be disadvantageous particularly in the soldering process. The reason for this procedure lies in the fact that at the stage of manufacturing the base material the position of the holes for the circuit is not known and the subsequent coating of the hole walls with adhesive is difficult and expensive.

For-the above-stated reasons, perforated printed circuit boards with a metal core have not yet become established in the industry although a technical requirement exists for them. In particular it would be desirable to exploit the high thermal and mechanical strength achievable with such boards and also the good thermal conductivity, which permits a denser arrangement of tracks and components.

DISCLOSURE OF THE INVENTION

It is accordingly an object of the invention to provide a simpler and more economical method for the manufacture of perforated base materials for printed circuits with a metal core.

It is another object of the invention to provide a method, as above, which permits a reliable insulation with respect to the metal core by means of a substantially uniform pore-free layer of insulating material which is as thin as possible - even in the holes and at the hole edges - and a firm anchoring of the conducting metal to the layer of insulating material on the panel surface and at the hole walls.

It is yet another object of the invention to provide a perforated base material produced by fhe above method.

These objects are achieved by providing a method for the production of an electrically insulating base material for the manufacture of perforated plated-through printed circuit panels with a metal core, in which a preperforated metal cord is coated with a thin, uniform, continuous coating of an insulating material and the insulating material is cured.

In particular, the method of the invention includes the steps of (a) applying a layer of first curable insulating material onto a panel having perforations, the layer covering at least one surface of the panel and hole walls formed by the perforations; (b) partially curing the insulating material to an extent sufficient to prevent substantial flowing of the material at elevated temperatures; (c) applying a layer of second curable insulating material over the layer of first material, the second material being thermally curable and present in an amount sufficient to effect sealing of the layer of first material; (d) partially curing the second material to an extent sufficent to prevent flowrng thereof, and (e) completely curing the layers.

The objects of the invention are also achieved by an electrically insulating base material for the production of perforated plated-through printed circuit panels comprising: (a) a metal core having at least one perforation defining a hole through said metal core and having a hole wall; (b) at least one layer of a first insulating material applied over a surface of the metal core including the hole wall; and (c) at least one layer of a second insulating material applied over the layer of first material, the second material sealing the layer of first material.

DETAILED DESCRIPTION OF THE PREFERRED EMBODIMENTS

In performing the method according to the invention, the metal core is first perforated at the desired points. The holes may be made by drilling or punching; as far as possible, the more inexpensive punching is preferred. The arrangement of the holes may be such that they are located only at the points of the plated-through holes needed later. Also, the holes may be placed in a grid-like pattern in order to make possible later a different arrangement of conductor track and plated-through holes. This procedure is described in German Patent Application No. 3,408,630.

Since, as a result of the punching, burrs are produced which may interfere with the subsequent insulation of the metal core, these must be removed in a further working step, e.g. by brushing or blasting with a grinding agent, in particular with sand. The oil used in the punching is removed by means of solvents and aqueous alkaline pickling solutions. If aluminum is used as the core material, it is advantageous to roughen the surface, including the hole walls, by known methods, e.g. electrochemically, chemically or mechanically, then to oxidize them anodically and to compact or to seal the oxide layer in hot water. Iron panels may be phosphated in a known manner. To increase the cleanliness and the uniformity of the surfaces, a further post-treatment may be carried out with ultrasound in a cleaning bath.

As the next step a curable insulating layer is applied by means of a spray method, a liquid lacquer in the form of superfine droplets being precipitated on the surface, including the hole walls. Preferably, an electrostatic spray method is used. The lacquer may be present partially or entirely as a solution, suspension or dispersion; it may contain monomers containing vinyl groups and an epoxy resin and, optionally, a hardener. The layer applied electrostatically has in general a layer weight per application in the region of 1 to 20, preferably of 4 to 16 $g/m^2$.

A further layer consisting of a thermally curable insulating material is applied from an aqueous, electrophoretically (preferably cataphoretically) operating dip lacquering bath which material is then freed of residual water by heating and crosslinked to an extent such that it is no longer capable of flowing but is still reactive. As a lacquering substance, for example, a modified epoxy resin/amine adduct in combination with an oligoester containing activated ester groups may be used.

Suitable lacquering substances are described, for example, in European Patent Application No. 82,291. This layer is in general substantially thinner than the first layer and preferably has a layer weight of about 0.05 to 5, in particular 0.1 to 1$g/m^2$.

As described above, the first layer is advantageously applied electrostatically, polymerized with UV light or by moderate heating, for example a few minutes at about 80° to about 120° C., and thereby precured so that this layer is no longer capable of flowing even when heated to elevated temperatures, but can still bond reactively to further layers on curing. The layer subsequently deposited cataphoretically then effects in particular a sealing of pores and voids in the first layer. For this reason, as specified above, only a low layer weight is required for this layer so that only relatively small quantities of the cataphoretically applied lacquering substance, which insulates less satisfactorily, are contained in the whole insulating layer. Coatings produced in this manner are pore-free and consequently after deposition of a copper layer are resistant to breakdown up to voltages of a few hundred volts. This is not achieved without the cataphoretic treatment. Coatings of insulating material produced by spraying are not resistant to breakdown even if repeated several times. Several layers of each type of coating, in particular of the electrostatic coating may be applied so that the total layer of insulating material attains a weight in the region of about 10 to 100 $g/m^2$. The cataphoretic dip coating may take place after any of the electrostatic coatings. Preferably, at least one more electrostatic spray coating is performed after the last cataphoretic coating since the anchoring of the metal layer, in particular copper layer, to, be applied subsequently is better on this layer.

When the electrostatically sprayed-on lacquer is applied it is essential to prevent the lacquer layer from flowing, on the one hand because the insulation is weakened at the points from which the lacquer flows away, and on the other hand because the holes are deformed by undesired flow of the lacquer layer, e.g. as a result of gravity.

This object is achieved by a method wherein, in addition to the lacquer resin substance, radically polymerizable vinyl compounds and photoinitiators are added to the lacquer and the sprayed-on lacquer layer is cured with ultraviolet light or by heating in the presence of a thermally activatable polymerization catalyst. Expediently, the infrared portion of the radiation source is filtered out to prevent an undesired heating and flow of the lacquer during he radiation.

As radically polymerizable vinyl compounds, mono- or polyethylenically unsaturated compounds are suitable such as are commonly used for the production of photopolymerizable mixtures or lacquers. In particular, acrylic acid and methacrylic acid esters of mono- and polyhydric alcohols are suitable. The alcohols may even contain other functional groups, for example epoxy groups, which may take part in a thermal crosslinking reaction. As photoinitiators known compounds are used which are sensitive in the near ultraviolet or in the shortwave visible spectral ranges and are excited to form radicals, for example, benzophenone derivatives, benzoin derivatives, polynuclear quinones, certain polynuclear heterocyclics such as acridine, phenazine and quinazoline derivatives, and also heterocyclics substituted by trichloromethyl groups. If a thermal polymerization is to take place during the precuring, common catalysts which can be activated by heat such as dicumyl peroxide or azodiisobutyronitrile, are added. The lacquer preferably contains in addition compounds which are crosslinkable by heating, for example combinations of epoxy resins and hardeners. These compounds are chosen in a manner such that they are only activated at higher temperatures than are necessary for the polymerization. The crosslinking takes place in general in a temperature range from about 150° to about 250° C.

It is expedient to add a readily volatile solvent or thinner to the lacquer to be sprayed. This makes possible, on the one hand, a precise metering during spraying and in addition, a rapid evaporation of a part of the solvent even during the spray process so that the lacquer droplets already have a substantially higher concentration and viscosity on striking the surface. The viscosity is additionally increased by the coldness due to evaporation so that in this manner an undesired flowing off of the lacquer can be almost entirely prevented before complete drying.

To improve the adhesion between the insulating layer and the metal (generally copper) to be deposited subsequently, a butadiene polymer may be added to the insulating lacquer as an anchoring agent. Usable anchoring agents are synthetic diene rubbers and rubber-free polymers. Example, of usable synthetic diene rubbers are butadiene polymers, butadiene/acrylonitrile co-polymers, isoprene rubber, chloroprene rubber, acrylonitrile/butadiene/styrene terpolymers and mixtures of at least two of the said synthetic rubbers. The anchoring agent containing the synthetic diene rubber or consisting of the latter makes possible the subsequent firm bonding of a conducting layer to the substrate; The synthetic diene rubber should be used in a quantity such that its weight, referred to the total quantity of synthetic diene rubber and thermosettable resin in the corresponding layer is about 10 to 70% by weight, preferably about 15 to 30% by weight.

The usable anchoring agents of the said types may contain inorganic fillers such as silicic acid, zirconium silicate or magnesium silicate which raise the viscosity and act as reinforcing material.

Referred to the total quantity of resin, the quantity of inorganic filler may be from about 3 to about 50%. The composition may additionally contain a hardening agent, for example an amine or acid anhydride. A pigment may furthermore be added to it.

In order to achieve a reliable and uniform covering and insulation, particularly of the hole walls, it may be advantageous to apply the spray lacquer in several steps sequentially, in which case a curing by polymerization should advantageously take place after each application. The lacquer composition of the individual layers may be the same each time. It may, however, also be modified. Thus, it is sufficient, for example, to introduce the adhesion-improving butadiene copolymer only into the uppermost layer.

After the polymerization a thermal curing may further be added, but this does not need to proceed to the complete thermal curing of the respective epoxy layer. Here too, as in the case of the electrophoretically deposited layer, it is even beneficial to perform the thermal curing initially only partially and to perform the complete curing only after the final lacquering step.

In preparation for the chemical deposition of metal, the surfaces are treated in a known manner in an organic solvent. They are then treated with an oxidizing agent to render them receptive for the subsequent metallizing step. In particular, the treatment with the oxidizing agent serves to roughen the layer surface. In addition, the layer is rendered hydrophilic. Usable oxidizing agents are, for example, chromic acid, salts of chromic acid, permanganate, chromic acid/fluoroboric acid mixtures, and chromic acid/sulfuric acid mixtures. In particular, mixtures of chromic acid and sulfuric acid make it possible for the conducting circuit pattern formed subsequently to be bonded firmly to the insulating layer. The surface is then detoxicated with bisulfite, post-treated with hot alkali hydroxide solution and finally washed out again in hot water containing complexing agents.

In all the steps of the method care should be taken to insure that the inner walls of the holes are also carefully treated, for example, by means of flow methods.

The panels pretreated in this way are treated in a commercial system of baths for the electroless deposition of metal (generally of copper). In this process the insulating layer surface is first activated in order that metal deposition can take place in the subsequent electroless metallization. In particular, palladium, which acts as a catalyst or activating agent in the electroless metallization, is deposited on the insulating layer surface. The activation treatment takes place, for example, by immersion of the substrate in a solution containing palladium chloride and tin(II) chloride and acidified with hydrochloric acid. It is furthermore possible to bring the substrate surface into contact with a tin(II) chloride solution acidified with hydrochloric acid and then with a palladium chloride solution. On the other hand, the substrate surface may also be brought into contact with a solution of an organic palladium complex and then treated with a weak reducing agent in order to deposit metallic palladium on the layer surface. The deposited palladium, i.e. the catalyst, makes possible an adequate deposition of the desired metal in the subsequent electroless metallization.

Finally, the substrate surface is subjected to an electroless metallization. Usable baths are, for example, copper, nickel or gold baths. Particularly well suited is a copper bath for electroless copperplating containing, for example, copper sulfate, ethylenediaminetetraacetate or Rochelle salt and formaldehyde. If necessary, sodium hydroxide, dipyridyl, polyethylene oxide and the like may be added to the bath. As a rule, the bath is kept at a temperature of from about 20° to about 75° C. During the electroless metallization the pH of the bath is adjusted to about 12.0 to 13.0.

In the method according to the invention, preferably both sides of the insulating material and the hole walls are coated with a conductive metal layer, in particular a copper layer. The thickness of the metal layer depends on the further processing planned. If the latter takes place by the semi-additive method, the layer must be of a quality such that it is coherent and makes possible the electroless, or preferably, electroplated build-up of homogeneous and defect-free metal layers of any desired thickness. In general, layer thicknesses of from about 0.1 to about 5 μm, preferably from about 0.2 to about 3 μm, are adequate for this purpose.

If the further processing is to be carried out subtractively by the printed circuit panel manufacturer, the layer thickness may in general be from about 5 to about 100 μm, preferably from about 10 to about 70 μm.

It is expedient to prepare the surface of the insulating material, including the hole walls in a known manner by cleaning, initial etching, nucleation etc. for the chemical and optionally electroplated metallization, since at this point in time the said steps can be performed in an efficient manner. The implementation takes place in a known manner by creating firmly adhering noble metal nuclei, for example palladium, or silver nuclei as is described, for example, in German Offenlegungsschrift No. 1,696,603 and U.S. Pat. No. 3,632,388, at which nuclei a coherent metal layer is then deposited electrolessly.

The panels treated in this way have extremely uniform and firmly adhering insulation and copper layers both on their surface and also in the hole walls. As a result of the completely uniform layers in the prepunched holes, the latter are not adversely affected in relation to their trueness to size so that there is no necessity to completely fill the holes first with insulating material and then to drill them out again.

The method is suitable both for the manufacture of individual panels and also for the production of strips.

If thin, flexible aluminum strips with a thickness, for example, of 100 μm are used for the method, thin and flexible, insulated and plated-through materials can be obtained which are suitable, for example, for use in multilayer circuits or flexible printed circuit panels.

The base material according to the invention is expediently supplied in the form of large size sheets or rolls to the printed panel manufacturer and further processed by the latter in a known manner. In this process the metal layer, for example copper layer, is covered with a template which corresponds to the structure of the desired circuit pattern. The template may be applied in a known manner by screenprinting or by the photoresist method. In this connection it is expedient to choose a method with which the holes can be completely covered. For this procedure, described as the tenting technique, a dry photoresist, for example is suitable.

The dry photoresist layer is laminated onto the copper layer, all the holes being covered. The resist layer is then exposed under a circuit pattern which reproduces the desired conductor tracks and the plated-through holes needed. After the exposure the resist layer is developed to form a template and the exposed copper etched (subtractively) or its thickness increased by electroplating and it is optionally further coated by electroplating with lead/tin alloy (semiadditive method). The resist template is then stripped and, in the semiadditive method, the base copper is etched away on the surface and in the holes. In this process it is not necessary to remove all the base copper. It is adequate if the surfaces of the base copper which are not required are separated from the conductor tracks and the plated-through holes by etching a gap. This may again expediently take place by covering with a suitable photoresist template. The "isolation etching" described has the advantage that in the processing substantially small quantities of used etch baths containing copper ions accrue. The exposure under the pattern has to take place in true registration with respect to the position of the holes. This may take place, for example, by the application of markings at the edge of the panel and aiming at the holes on the basis of these markings.

By the method according to the invention the result is achieved in that prepunched printed circuit panels with a metal core are made available which have uniform, firmly adhering insulating material coatings and firmly adhering conductor metal layers even at the inner walls of the plated-through holes. The dividing up of the insulating layer coating and curing into two curing mechanisms has the advantage that melting and running of the layer during the thermal curing are prevented by the preceding photo curing or photo crosslinking. The actual consolidation of the layers and their indissoluble bonding to each other and to the metal substrate is then achieved by thermal curing.

The following examples elucidate preferred embodiments of the invention.

EXAMPLE 1

A. Preparation

An aluminum strip 0.3 mm thick was provided by punching with holes of 1 mm diameter and 2.5 mm hole spacing in the form of a repeating pattern, the perforated regions alternating with unperforated surfaces. The punching burrs were removed by brushing and the residues of the oil used in the punching by washing off with acetone. The strip was then pickled on both sides (including the hole walls) in an alkaline solution containing 1.6% NaOH, 0.4% $Na_2CO_3$ and 0.1% $Na_3PO_4$ at 80° C. for 60–80 seconds and grained in a nitric acid electrolyte (approx. 10 g/l $HNO_3$) at 40° C., 20 A/dm$^2$ for 17–20 seconds with an alternating supply of 20 V; anodizing was then performed in the sulfuric acid bath with a dc supply (40° C., 20 V, 24 A/dm$^2$, 150 g/l $H_2SO_4$; 4 g/m$^2$ oxide on each side).

The oxide layer was compacted by immersion in hot water (95° C.; 1–2 minutes).

The strip was then cut up into panels.

B. Insulation coating

The panels were lacquered in an electrostatic spray coating plant with the following solution:

| | | |
|---|---|---|
| I | Epoxy resin with terminal acrylate groups (65% in toluene) | 172 parts by weight |
| | Plasticized epoxy resin (epoxide equivalent weight approx. 450; dynamic viscosity 10–15 Pa.s) | 100 parts by weight |
| | Epoxy resin (epoxide equivalent weight 190) | 100 parts by weight |
| | Glycidyl methacrylate | 112 parts by weight |
| | n-Butyl methacrylate | 22 parts by weight |
| | Methyl methacrylate | 22 parts by weight |
| | Hexahydrophthalic acid anhydride | 182.8 parts by weight |
| | Benzyltriethylammonium chloride | 1.5 parts by weight |
| | 2-Hydroxy-2-methyl-1-phenylpropan-1-one | 26 parts by weight |
| II | Finely divided silicic acid dispersed in butanone by homogenization with a high-velocity stirrer (Ultraturrax) | 100 parts by weight 900 parts by weight |
| III | Copolymer of 62% butadiene | 100 parts by weight |

-continued

| | | |
|---|---|---|
| and 38% acrylonitrile | | |
| Xylene | 720 | parts by weight |
| Butanone | 180 | parts by weight |
| Final Solution: | | |
| Solution I | 145 | parts by weight |
| Suspension II | 126 | parts by weight |
| Solution III | 150 | parts by weight |
| Xylene | 576 | parts by weight |

Conditions were chosen in a manner such that 12 g/m² were applied to each side. The lacquer was pre-dried immediately after application in a cold airstream and then exposed for 1 minute to the radiation of an Hg high-pressure lamp, in which process the monomers contained therein polymerized. The layers were then part-cured for a further 1 minute at 180° C.

The panels were then treated in an aqueous cataphoretic dipping bath, which contained an epoxy resin/amine adduct neutralized with acid and an oligoester having activated ester groups in an aqueous dispersion (solids content: 12%), with an electrode spacing of 3 cm, a dc voltage of 125 V and at 28° C. for 2 minutes, then rinsed and partially cured for 3-5 minutes at 180° C. As a result of the cataphoretic treatment a layer with a weight of 0.3 g/m² was applied.

The electrostatic coating with subsequent part curing was then repeated a further four times. Finally, the entire coating was thoroughly cured at 180° C. in the course of an hour. The insulation layer of the panel had a thickness of 60-65 μm.

C. Chromic acid digestion

For the further treatment, the panel was first wet-brushed and then pretreated with butanone in a known manner for 1 minute, then roughened with hot chromosulfuric acid at 40° C., carefully detoxicated with sodium bisfulfite, and treated for 3 minutes with 3% hydrofluoric acid and then with hot alkaline solution. The panels were finally brushed off under running water and then rewashed with hot water which contained a small amount of complexing agent. As far as necessary, careful rinsing with water was carried out between the individual steps.

D. Chemical copper deposition

The panels were treated in a commercial system of baths (tin chloride, palladium chloride, accelerator, chemical copper deposition bath) and then held again for 15 minutes at 140° C.

Result

The panels then have a layer of insulating material on their entire surface, including the hole walls, and on top of the layer of insulating mateial a uniform, firmly adhering coating of copper 0.3 μm thick. It was not possible to observe any peeling effects in a soldering bath (255°-260° C.). Measurement of the hole diameters revealed no measurable deviations from the circular form of the original punched holes after insulating and copperplating. They had not been deformed eliptically by running lacquer; it was not possible to observe any drop formation in the holes, or any wedge formation or hourglass shape. The hole diameter had been reduced only by the total thickness of the insulating and the copper layer. In the case of the present example this was 2 x approx. 60-65 μm.

EXAMPLE 2
(COMPARATIVE EXAMPLE)

The procedure was as in Example 1, but the treatment in the cataphoretic dipping bath was omitted. The thickness of the layer of insulation material was approx. 60 μm.

From several panels, which had in each case been manufactured according to Example 1 and Example 2 and then coated with copper, the copper layer and the insulating layer was in each case removed at one point so that the aluminum core was exposed. By means of contacts the bare aluminum position and the copper coating were then connected to the poles of a regulating transformer so that there was a voltage between the aluminum core and the copper coating.

In the samples produced according to Example 1 it was possible for the voltage to be raised to more than 200 V without current breakdown occurring between the two metal layers. On the other hand, the panels produced according to Example 2 exhibited current breakdowns even at voltages between 30 and 70 V which were revealed by local burning of the insulating layer and fusing together of the copper and aluminum layers, usually in the immediate neighborhood of hole edges.

In the following table the results of experiments with panels which were produced according to Example 1 (according to the invention) and according to Example 2 (comparison) are shown. In the experiments a-d according to Example 1, layers of various thickness were first sprayed on electrostatically, then a thin layer was deposited cataphoretically and then a further one or more layers were sprayed on electrostatically. All the layers exhibited good soldering bath resistance and adhesion.

The experiments e-g are comparative experiments according to Example 2, i.e. without cataphoretic deposition. Accordingly, high current transmissions were measured even at low voltage. Even in these cases adhesion and solder bath resistance were good.

TABLE

| Experi-ment | Quantity applied g/m² | | Current transmission | |
| | Electro-static | Cata-phoretic | V | A |
|---|---|---|---|---|
| a | 12 + 60 | 0.3 | 200 | 0 |
| b | 12 + 12 | 0.3 | 200 | 0 |
| c | 24 + 50 | 0.3 | 200 | 0 |
| d | 50 + 24 | 0.3 | 200 | 0 |
| e | 12 | 0 | 40–50 | 20 |
| f | 36 | 0 | 40–50 | 20 |
| g | 72 | 0 | 40–50 | 5 |

EXAMPLE 3
(COMPARATIVE EXAMPLE)

The procedure was as described in Example 1, but the insulating layer was applied in a manner such that the panels were first subjected to a cataphoretic dip lacquering and then spray-coated four times electrostatically. The layer weight of the entire insulation layer was in this case approx. 20 g/m² higher than in Example 1. The electrical resistance to breakdown was satisfactory.

To test the solder bath resistance samples, produced according to Example 1 and 3 were reinforced by electroplating so that a copper layer of approx. 35 μm was obtained. From the panels, strips 4 cm wide and approx. 10 cm long were cut and these were immersed for 10 seconds in a metal bath at 255°–260° C. While the strips produced according to Example 1 survived the experiment undamaged, the strips produced according to Example 3 exhibited blistery defoliations.

From the panels produced according to Example 1 and reinforced by electroplating strips 2 cm wide and approx. 8–10 cm long were cut. The adhesion of the copper layers to the strips was tested, the copper layer being carefully separated from the insulating layer at one end. The end peeled off was pulled off in a tensile strength measuring apparatus perpendicularly to the panel surface at a defined pulling rate and the tensional force required for this measured. The test was performed both before and after the action of a soldering bath as described above. In both cases adhesive forces of at least 25 N per 2 cm strip width were measured.

EXAMPLE 4

Further processing by the subtractive method

One of the panels produced according to Example 1 A to D was provided by electroplating deposition with a copper coating of 35 μm; then a dry resist film with a 25 μm thick photopolymerizable layer was laminated on to both sides by means of a commercial laminator.

Each dry resist film was exposed under a negative of a circuit pattern, the carrier film was pulled off the resist and the layer was developed with an aqueous alkaline solution, the unexposed layer regions being washed out. The bared copper was etched away.

EXAMPLE 5

Processing by the semiadditive method

A panel produced according to Example 1 A to D was coated on both sides by means of a commercial laminator with a dry resist film whose photopolymerizable resist layer was approx. 65 μm thick. The dry resist films were exposed under a positive of the desired circuit pattern, the carrier films were pulled off the resist layer and the layer developed, the unexposed layer regions being washed out. The bared copper areas and holes were reinforced by electroplating to approx. 50 μm in a commercial copper bath, then a layer about 10 μm thick of lead/tin alloy was deposited by electroplating on the copper using a commercial lead/tin bath. The resist pattern was stripped and the bared base copper underneath etched away.

EXAMPLE 6

Processing by the additive method

A panel produced according to Example 1 A to C was laminated on both sides with a negatively functioning dry resist film after the chromic acid digestion and before the chemical copper deposition, exposed under the positive of the desired circuit pattern, the carrier film removed and the resist layer developed with the unexposed layer regions being washed out. As described under D, the panel was then treated in a commercial system of baths (tin chloride, palladium chloride, accelerator). The resist template was then removed, the panel was briefly dipped in hot dilute sulfuric acid at approx. 40° C. and rinsed. Copper was electrolessly deposited on the surfaces and hole walls, which were ladn with Pd nuclei, from a commercial bath.

EXAMPLE 7

The procedure was as in Example 1, A to D. However the thickness of the aluminum panel used was 1 mm and the diameter of the holes 0.4 mm. After the application of the insulating layer and the chemically deposited copper layer, the coating of the hole wall was approx. 60 μm thick and very uniform. An "egg-timer shape" was not observed. The original hole diameter of 0.4 mm had uniformly changed to approx. 0.28 mm.

What is claimed is:

1. A method for producing an electrically insulating base material for a perforated plate-through printed circuit panel, comprising:
    (a) applying a layer of first curable insulating material by electrostatically spraying said material onto a panel having perforations, said layer covering at least one surface of said panel and covering hole walls formed by said perforations;
    (b) partially curing said insulating material to an extent sufficient to prevent substantial flowing of said material at an elevated temperature;
    (c) applying, by means of an aqueous, electrophoretically operating dip-lacquering bath, a layer of second curable insulating material over said layer of first material, said second material being thermally curable and present in an amount sufficient to effect sealing of said layer of first material;
    (d) drying and thereafter partially curing said second material by crosslinking to an extent sufficient to prevent flowing of said second material; and
    (e) completely curing said layers.

2. A method as claimed in claim 1, wherein said method includes sequentially applying and partially curing a plurality of layers of said first material to said panel, wherein at least one layer of said second material is applied and partially cured between two adjacent layers of said first material.

3. A method as claimed in claim 1, wherein said first material includes at least one compound containing radically polymerizable groups, said first material being partially curable by one of radiation and heating in the presence of a catalyst, and wherein said first material contains groups which crosslink at a temperature higher than that of said partial curing by heating.

4. A method as claimed in claim 1, wherein said partial curing of said layer of insulating material is performed at a temperature of from about 80° to about 120° C. and said complete curing step is performed at a temperature of from about 150° to about 250° C.

5. A method as claimed in claim 1, wherein said partial curing of said first material is by radiation, and wherein said first material contains a radically polymerizable compound and a photoinitiator.

6. A method as claimed in claim 5, wherein said first insulating material further contains an epoxy resin and a thermally activatable epoxy hardener.

7. A method as claimed in claim 1, wherein said panel comprises aluminum or an aluminum alloy.

8. A method as claimed in claim 7, wherein the surface of said aluminum or aluminum alloy panel, including said hole walls of said perforations, is pickled, roughened, anodically oxidized and then compacted before said first curable insulating material is applied.

9. A method as claimed in claim 1, wherein said second curable insulating material includes an epoxy resin containing amino groups, and a thermally activatable epoxy hardener.

10. A method as claimed in claim 1, wherein said panel core includes a plurality of said perforations which are distributed in a regular pattern over the surface of said panel.

11. A method as claimed in claim 1, wherein said layer of first material has a weight of from about 1 to about 20 g/m².

12. A method as claimed in claim 1, wherein said layer of second material has a weight of from about 0.1 to about 1.0 g/m².

13. A method as claimed in claim 1, wherein said first material includes an anchoring agent selected from diene rubbers and rubber-free polymers.

14. A method as claimed in claim 1, wherein said partial curing step (b) is carried out at a first temperature that is lower than said elevated temperature, and wherein said curing step (e) is carried out at said elevated temperature.

15. An electrically insulating base material for a perforated plated-through printed circuit panel, produced by a method as defined by claim 1.

16. A base material as claimed in claim 15, wherein said method includes sequentially applying and partially curing a plurality of layers of said first material to said panel, wherein at least one layer of said second material is applied and partially cured between two adjacent layers of said first material.

17. A base material as claimed in claim 15, wherein said first material includes at least one compound containing radically polymerizable groups, said first material being partially curable by radiation or by heating in the presence of a catalyst, and wherein said first material further comprises groups which crosslink at a temperature higher than that of said partial curing by heating.

* * * * *

UNITED STATES PATENT AND TRADEMARK OFFICE
CERTIFICATE OF CORRECTION

PATENT NO. : 4,783,247

DATED : November 8, 1988

INVENTOR(S) : Markus Seibel

It is certified that error appears in the above-identified patent and that said Letters Patent is hereby corrected as shown below:

Column 12, Claim 1, line 13, "plate-through" should read -- plated-through --.

Column 13, Claim 10, line 2, delete "core".

Signed and Sealed this

Twelfth Day of September, 1989

Attest:

DONALD J. QUIGG

*Attesting Officer*  Commissioner of Patents and Trademarks